US006567297B2

(12) United States Patent
Baker

(10) Patent No.: US 6,567,297 B2
(45) Date of Patent: May 20, 2003

(54) METHOD AND APPARATUS FOR SENSING RESISTANCE VALUES OF MEMORY CELLS

(75) Inventor: R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/774,798

(22) Filed: Feb. 1, 2001

(65) Prior Publication Data

US 2002/0101758 A1 Aug. 1, 2002

(51) Int. Cl.[7] ................................. G11C 11/00
(52) U.S. Cl. ................. 365/148; 365/210; 365/149; 365/50; 365/173; 365/185.21
(58) Field of Search ................. 365/148, 210, 365/149, 173, 189.07, 185.21, 50

(56) References Cited

U.S. PATENT DOCUMENTS

| 5,650,958 | A | | 7/1997 | Gallagher et al. |
| 5,774,404 | A | * | 6/1998 | Eto ............................ 365/222 |
| 5,841,692 | A | | 11/1998 | Gallagher et al. |
| 5,963,472 | A | * | 10/1999 | Inada et al. ................. 365/175 |
| 6,071,769 | A | | 6/2000 | Lee et al. |
| 6,072,718 | A | | 6/2000 | Abraham et al. |
| 6,097,579 | A | | 8/2000 | Gill |
| 6,134,139 | A | | 10/2000 | Bhattacharyya et al. |
| 6,181,610 | B1 | * | 1/2001 | Shiga ..................... 365/189.05 |
| 6,205,073 | B1 | * | 3/2001 | Naji ........................... 365/209 |
| 6,256,247 | B1 | * | 7/2001 | Perner ........................ 365/209 |

OTHER PUBLICATIONS

Mark Johnson, "Magnetoelectronic Memories Last and Last . . . ," *IEEE Spectrum*, Feb. 2000, pp. 33–40.

* cited by examiner

*Primary Examiner*—David Nelms
*Assistant Examiner*—Connie C. Yoha
(74) *Attorney, Agent, or Firm*—Dickstein Shapiro Morin & Oshinsky LLP

(57) ABSTRACT

A method for sensing the resistance value of a resistor-based memory cell. A current is driven through all unused row lines of a memory array while grounding the row line associated with the selected cell, thereby forcing the current through a comparatively low equivalent resistance formed by the parallel coupling of all unselected memory cells and also through a comparatively high resistance of the selected memory cell. The voltage on a column line corresponding to the selected memory cell is then measured to ground. The voltage level corresponds to either one of two resistance values (i.e., signifying either a logic "HIGH" or a logic "LOW").

53 Claims, 12 Drawing Sheets

METHOD AND APPARATUS FOR SENSING RESISTANCE VALUES OF MEMORY CELLS

BACKGROUND OF THE INVENTION

1. Field of the Invention

The present invention relates to the field of resistor-based memory circuits. More particularly, it relates to a method for accurately sensing the resistance value of a resistor-based memory cell, for example, an MRAM magnetic memory cell.

2. Description of the Related Art

A resistor-based memory, such as that depicted in FIG. 1, typically consists of a memory cell array 150 having intersecting row lines 100 and column lines 110 connected by resistors 120. A resistor-based memory such as, for example, a magnetic random access memory (MRAM), typically includes an array of resistor-based, magnetic memory cells.

A typical magnetic memory cell includes a layer of magnetic film in which magnetization is alterable and a layer of magnetic film in which magnetization is fixed or "pinned" in a particular direction. The magnetic film having alterable magnetization may be referred to as a data storage layer and the magnetic film which is pinned may be referred to as a reference layer.

Typically, the logic state of a magnetic memory cell is indicated by its resistance which depends on the relative orientations of magnetization in its data storage and reference layers. A magnetic memory cell is typically in a low resistance state if the orientation of magnetization in its data storage layer is substantially parallel to the orientation of magnetization in its reference layer. A magnetic memory cell is typically in a high resistance state if the orientation of magnetization in its data storage layer is substantially anti-parallel to the orientation of magnetization in its reference layer.

A magnetic memory cell is usually written to a desired logic state by applying external magnetic fields that rotate the orientation of magnetization in its data storage layer. Typically, the orientation of magnetization in the data storage layer aligns along an axis of the data storage layer that is commonly referred to as its easy axis. External magnetic fields are applied to flip the orientation of magnetization in the data storage layer along its easy axis to either a parallel or anti-parallel orientation with respect to the orientation of magnetization in the reference layer depending on the desired logic state.

When the orientation of magnetization is flipped, the resistance of the memory cell is altered between two different values. One resistance value, e.g., the higher value, may be selected to signify a logic "HIGH" while the other resistance value, e.g., the lower value, may be selected to signify a logic "LOW."

The value of each memory cell is determined by measuring the resistance value of the cell so as to determine whether the cell corresponds to a logic "HIGH" or logic "LOW." This measuring process had been made difficult due to several factors.

First, there is typically little to no isolation between memory cells. For example, turning to FIG. 2, which depicts a smaller portion of the FIG. 1 memory array, if an array consists of 1024 rows and 1024 columns, i.e., approximately 1 million cells, and each cell contains a resistance of 1.2 MΩ or 800 KΩ, depending on its logic state, the measured resistance when all rows and all columns, except for those associated with the selected cell, are respectively shorted together (e.g., during a read operation as depicted by dotted lines in FIG. 1) will be approximately 1 Ω, leaving very little isolation between cells. Low isolation renders the measuring of the resistance value of a particular memory cell difficult. Currently available solutions to the isolation problem include inserting a metal oxide semiconductor field effect transistor (MOSFET) or a diode in the memory cell in order to change the resistance value, malting it easier to detect. This solution is overly complex, increases the size of the memory cell and complicates the manufacturing process.

Turning now to FIG. 3, a typical resistance sensing circuit is depicted. The unknown parallel paths are represented by an equivalent resistance 300 of approximately 1 KΩ. The resistive element 210 of the selected cell is 1.2 MΩ. The column line 230 and the unused row lines are maintained at some known voltage. The current through the resistance 300 of the unused row lines is kept as close to zero as practical by maintaining a zero difference of potential across the resistance 300. The voltage across the 1.2 MΩ resistance 210 to ground (at node A) is then read. One of the problems associated with the FIG. 3 circuit is that it is very difficult to maintain a zero difference of potential across the unused resistors 300, and, therefore, there is always a non-zero current flow through resistance 300, thus affecting the voltage reading at node A and making the reading of resistance 210 difficult and unreliable. For example, if the difference of potential across points A and B, that is, across resistor 300, is 2 mV, then the current through resistance 300 is approximately 2 μA and if the voltage at node A to ground is maintained at e.g., 2 V, the current through resistance 210 is approximately 1.7 μA. Since the voltage differences between points A and B are not stable, the current through resistor 300 varies, thereby posing serious problems when reading the contents of a memory cell.

Another concern is that since the resistance values of each cell are so high (e.g., approximately 1 MΩ), large (RC) time constants will be experienced in the parasitic paths (i.e., for the unused cells). As known in the art, these large RC constants increase the time required to read out the contents of a memory cell. For example, the inherent discharge times can be undesirably long when all of the rows, except for the one being read out, and columns are pre-charged to some voltage. Furthermore, large resistance variations are typically experienced from cell to cell depending upon the processing employed during manufacturing, thus leading to less reliability during the measurement process. At least for those reasons described above, a simplified, more reliable method of sensing the resistance value of a resistor-based memory cell is desirable.

SUMMARY OF THE INVENTION

The present invention overcomes the problems associated with the prior art and provides a simplified and reliable method for sensing the resistance value of a resistor-based memory cell. A current is driven through all unused row lines of a memory array while grounding the row line associated with the selected cell, thereby forcing the current through a comparatively low equivalent resistance (e.g., 1 KΩ) and also through a comparatively high resistance (e.g., 1.2 MΩ or 800 KΩ) of the selected memory cell. The voltage on the column line corresponding to the selected memory cell is then measured to ground. The voltage level corresponds to either one of two resistance values (i.e., signifying either a logic "HIGH" or a logic "LOW").

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

The present invention will be described as set forth in exemplary embodiments illustrated in FIGS. 4–14. Other embodiments may be realized and other changes may be made to the disclosed embodiments without departing from the spirit or scope of the present invention.

Figure 4:
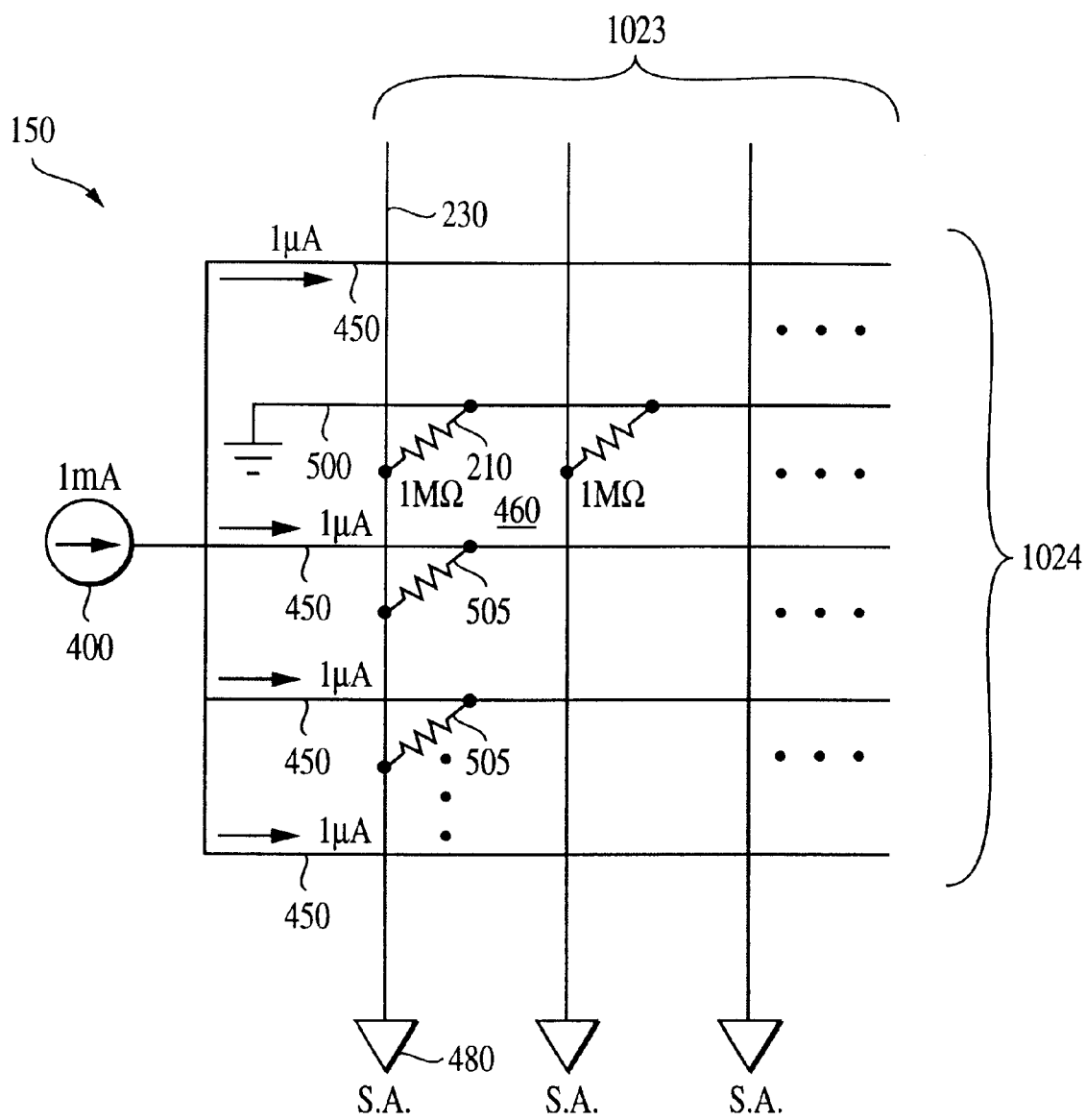
FIG. 4 illustrates a resistance sensing circuit in accordance with a first exemplary embodiment of the invention.

FIG. 4 illustrates a resistance sensing circuit for sensing the resistance value of a resistor-based memory cell, in accordance with a first exemplary embodiment of the invention. A current source 400 delivers a small current (e.g., 1 mA) to the memory array 150 such that each of the unused row lines 450 of the memory array 150 conducts approximately 1 $\mu$A (i.e., assuming a 1024×1024 array). The row line 500 associated with a selected cell 460 is driven to ground. Each of the unused row lines 450 coupled to the column line 230 associated with the selected cell 460 is shorted to the others so that an equivalent resistance of approximately 1 K$\Omega$ is read at column line 230.

Figure 1:
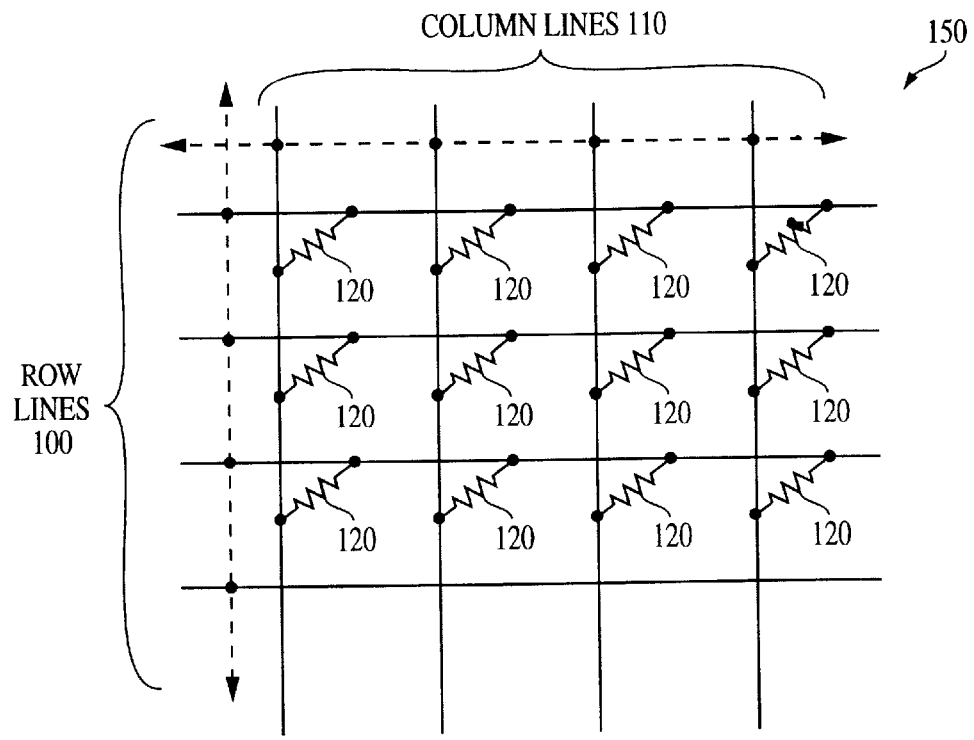
FIG. 1 illustrates a typical resistor-based memory cell array.
Figure 2:
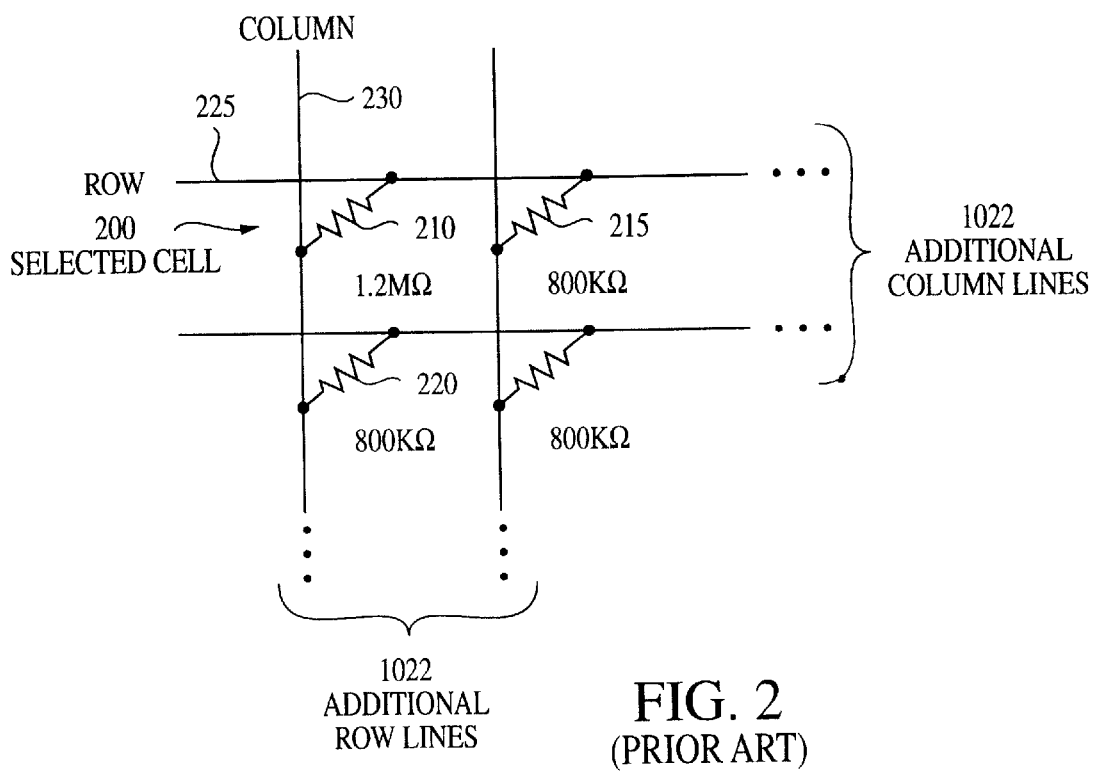
FIG. 2 illustrates a desired cell of the FIG. 1 memory cell array.
Figure 3:
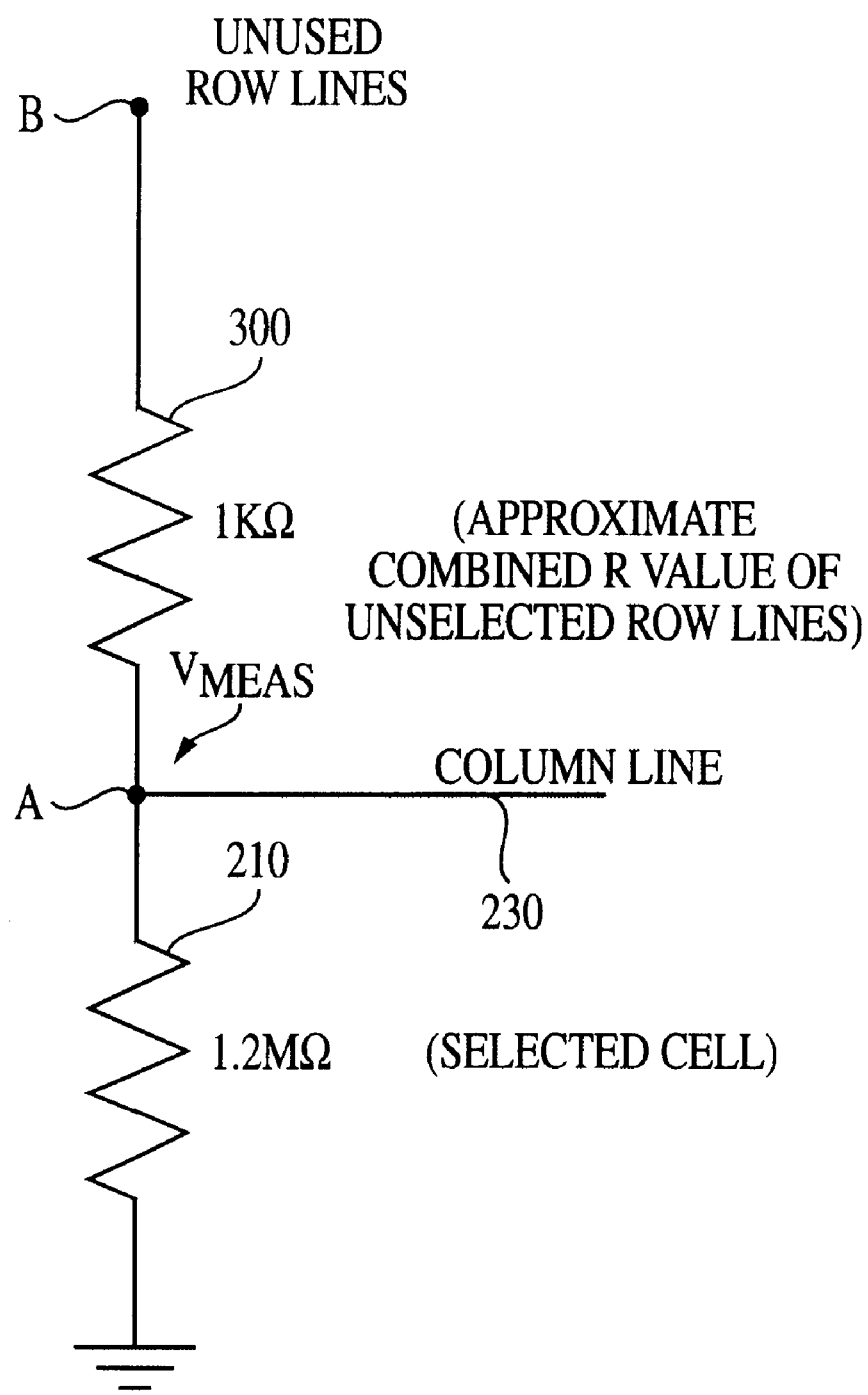
FIG. 3 illustrates a typical resistance sensing circuit.
Figure 5:
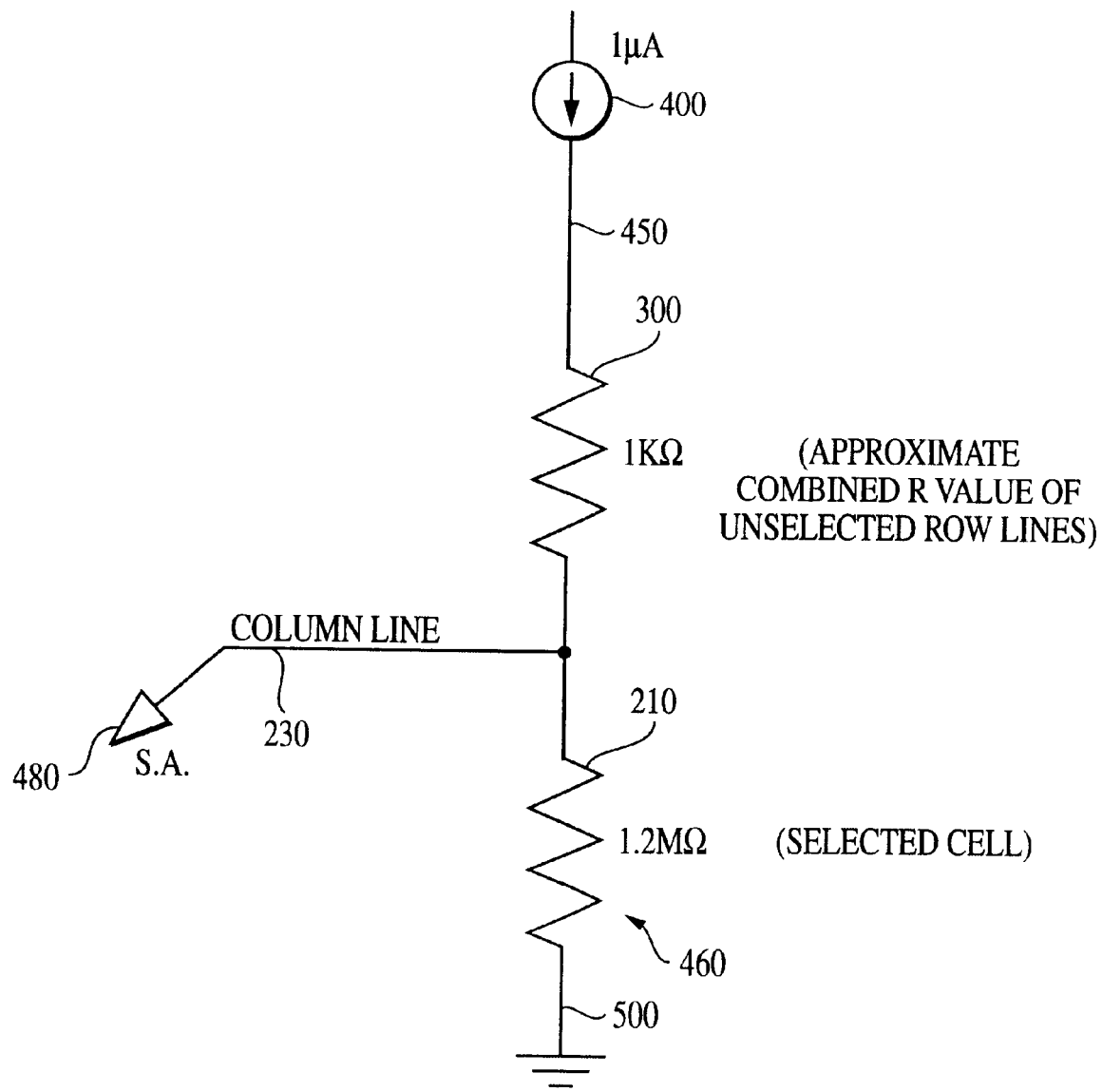
FIG. 5 illustrates a resistance sensing circuit in accordance with the first exemplary embodiment of the invention.

Turning to FIG. 5, an equivalent circuit schematic diagram of the FIG. 4 resistance sensing circuit is depicted. The 1.2 M$\Omega$ or 800 K$\Omega$ resistance of the selected cell 460 is coupled between the column line 230 and the row line 500 which is driven to ground. For purposes of discussion, it is assumed that the resistance value for cell 460 is 1.2 M$\Omega$. The equivalent resistance 300 of the unused memory cells is represented as 1 K$\Omega$ in series with the 1.2 M$\Omega$ resistance of the desired cell 460. The current source 400 drives approximately 1 $\mu$A through each of the unused row lines 450 so that a voltage drop appears at each of the resistors 300, 210. The value of the voltage read across the resistance of the desired cell 460 is fed to a sense amplifier 480 where a determination is made as to the logic value of the selected memory cell 460. That is, unlike the prior art configurations of FIGS. 2–3, the FIG. 4 embodiment drives a constant, known current through both resistances 300 and 210, thereby making the measurement of resistance 210 both easier and more reliable.

Figure 6:
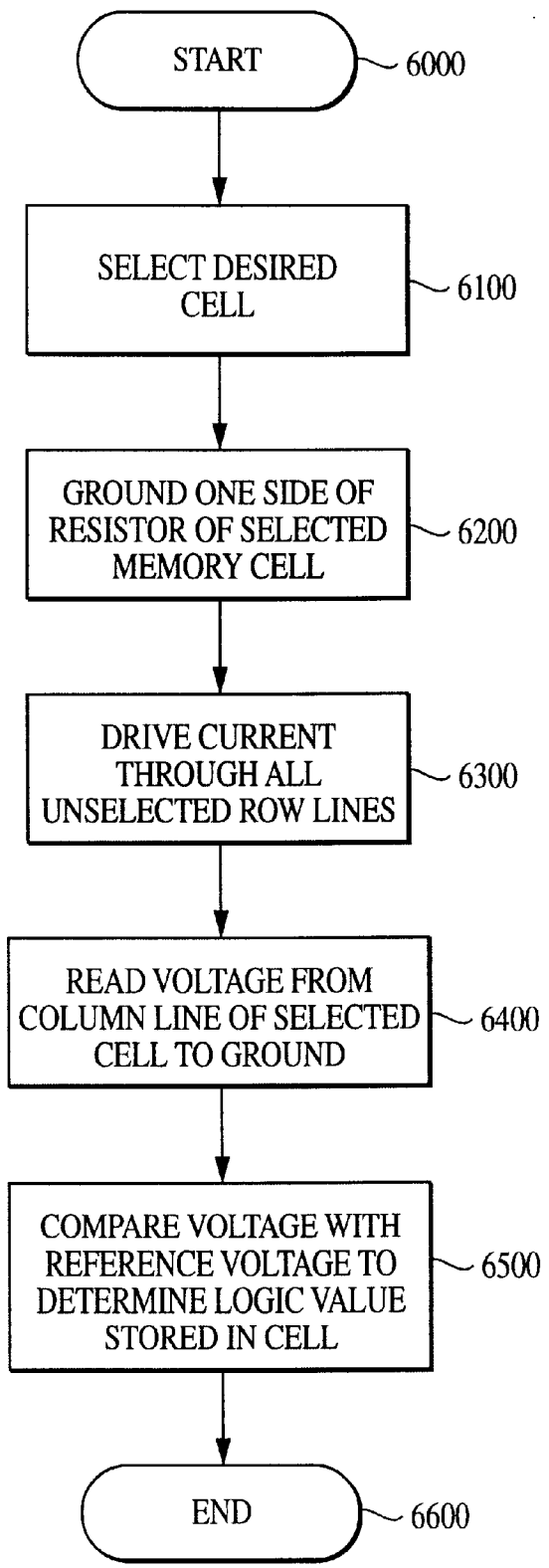
FIG. 6 depicts a flowchart of an operational flow in accordance with an exemplary embodiment of the invention.

Turning now to FIG. 6, a flowchart of an operational flow of an exemplary resistance memory containing the memory cell reading circuit of FIGS. 4, 5 is depicted. The flow begins at process segment 6000. At segment 6100, a cell 460 is selected. One side of the resistor 210 of the selected memory cell 460 is grounded by grounding the associated wordline (row) at segment 6200. At segment 6300, a current is driven through all unselected row lines. At segment 6400, a voltage measurement is taken from the column line 230 that is associated with the selected memory cell 460 to ground. The measured voltage is compared with a reference voltage at segment 6500 to determine the cell resistance value and, ultimately, the logic value stored in the cell 460. The process flow ends at segment 6600.

Figure 7:
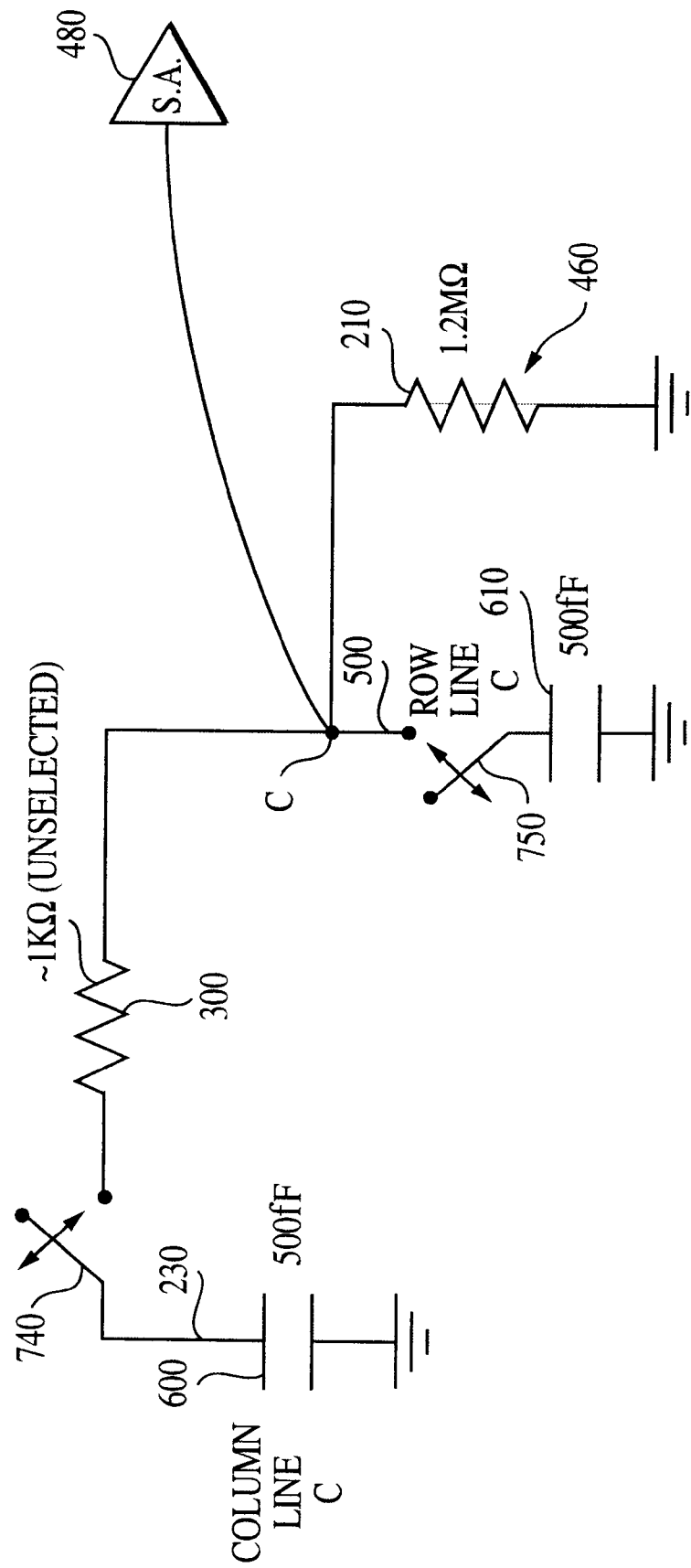
FIG. 7 illustrates an RC circuit for use with sensing resistance in accordance with a second exemplary embodiment of the invention.

Turning now to FIG. 7, an RC circuit for use with a resistance sensing circuit is depicted in accordance with a second embodiment of the invention. The FIG. 7 circuit may be employed to carry out the current driving described above with reference to segment 6300 of the FIG. 6 flowchart. The FIG. 7 circuit may be desirable in lieu of a constant current source when the rate of charging of the array 150 is comparatively slow. For example, if the capacitance of the column line 230 is 500 fF and the current being driven by constant current source 400 is approximately 1 $\mu$A, since i=C(dv/dt), the rate of charging the array 150 is 2 mV/ns (i.e., very slow).

An alternative to driving these very small constant currents through the array 150 is to charge the array 150 up to a predetermined voltage. In the FIG. 5 schematic, the equivalent resistance 300 is coupled to the resistance 210 of the selected cell 460; however, in the FIG. 7 embodiment, the capacitance 610 of the row line 500 associated with the selected cell 460 and the capacitance 600 of the column line 230 associated with the selected cell 460 form two RC circuits. In accordance with the second embodiment of the invention, rather than forcing a current through the array 150 with a constant current source (as in FIG. 5), the array is charged to a predetermined voltage (e.g., by charging both capacitors 600 and 610 to 1 V), then switches 740 and 750 are closed and capacitors 600, 610 are respectively discharged across resistors 300, 210. The voltage measured at point C is then fed into sense amplifier 480 where it is compared with a reference voltage in order to determine the value of the resistor 210, the reference voltage being of a value halfway between a voltage expected for an 800 K$\Omega$ resistor and a 1.2 M$\Omega$ resistor.

Figure 8:
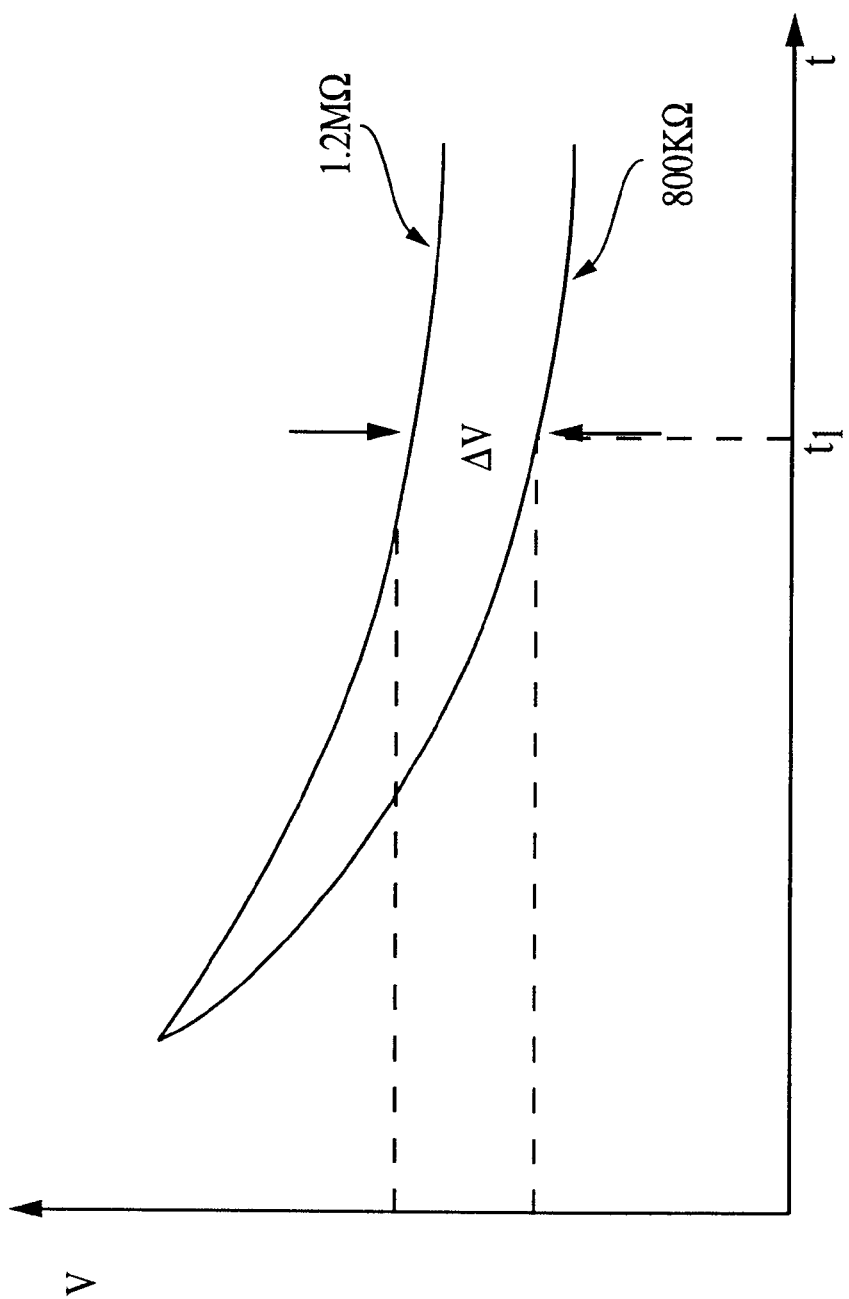
FIG. 8 is a graphical representation of voltage levels measured using the FIG. 7 circuit.

Turning now to FIG. 8, exemplary discharge curves for a 1.2 M$\Omega$ resistor and an 800 K$\Omega$ resistor as two possible resistance values for a cell are depicted. Here the voltages of the two resistors are monitored at a predetermined time period ($t_1$). The measured voltages will differ proportionally at time $t_1$, depending upon the value of the resistance (e.g., 800 K$\Omega$ vs. 1.2 M$\Omega$). The difference in voltage $\Delta V$ is used to determine the logic level being stored in the memory cell 460.

Figure 9:
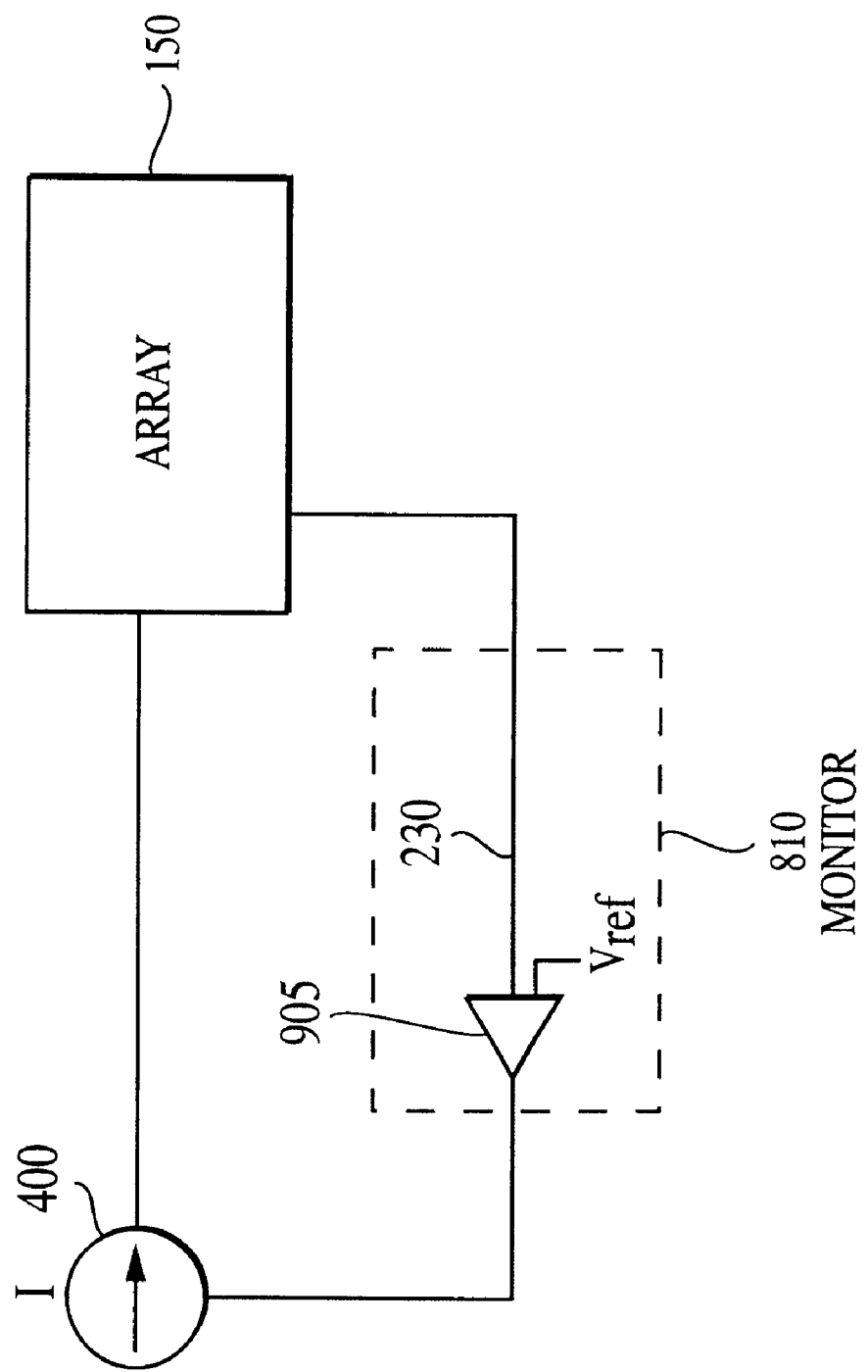
FIG. 9 illustrates a control system in accordance with a third exemplary embodiment of the invention.

Turning to FIG. 9, a control circuit is depicted in accordance with a third exemplary embodiment of the invention.

A constant current source 400 is coupled to memory array 150 in the manner shown in the FIG. 5 embodiment. A monitor 810 is coupled to a column line (e.g., 230) associated with a predetermined memory cell (e.g., 460) of array 150 for detecting the voltage being measured at the column line 230. Monitor 810 contains, e.g., a comparator 905. An input of comparator 905 receives the voltage on column line 230 and a second input of comparator 905 receives a reference voltage $V_{ref}$. If the voltage being measured at the selected memory cell (e.g., at 230), or cells, is above or below a predetermined value ($V_{ref}$), the monitor 810 sends a control signal to constant current source 400 to increase or decrease the current level being delivered to the array 150 and being driven through the unused row lines of the memory array 150. For example, if in the FIG. 4 schematic diagram, a voltage corresponding to a 1.2 MΩ resistor falls below a predetermined threshold level (e.g., 1.0 V), the FIG. 9 control system ensures that the output level of the constant current source 400 is increased by an amount sufficient to maintain the voltage reading across the 1.2 MΩ resistors at the predetermined threshold level (e.g., 1.0 V).

Figure 10:
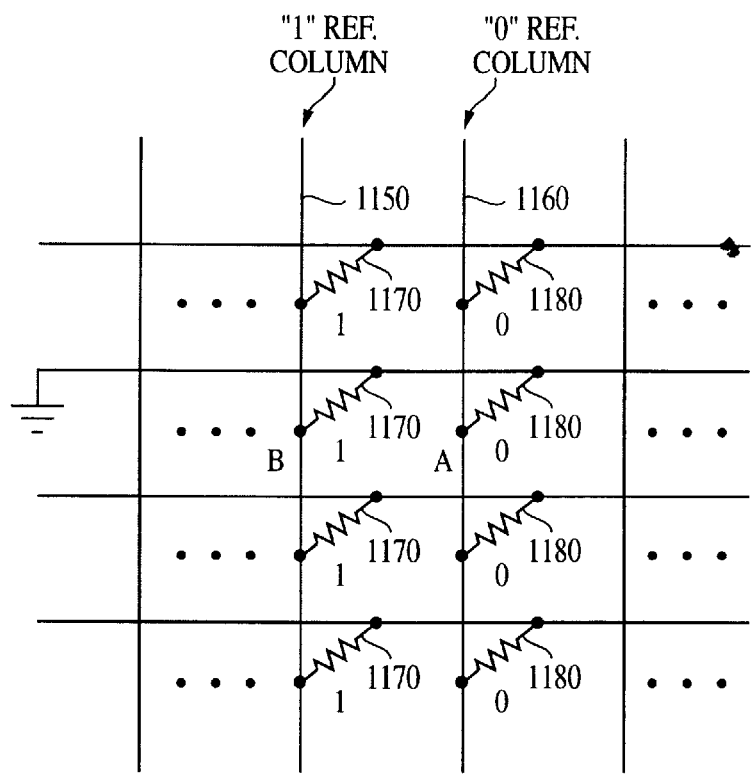
FIG. 10 illustrates reference columns for use with a memory array in accordance with a fourth exemplary embodiment of the invention.

Turning now to FIG. 10, reference columns 1150, 1160 for use with the sense reference amplifiers 480 (of FIGS. 4 and 5) are depicted. Each of the reference columns 1150, 1160 is coupled to one end of each of a plurality of reference resistors 1170 and 1180. The other end of reference resistors 1170 and 1180 is coupled to the row lines of the memory array 150. The resistance values of resistors 1170 are the same and the resistance values of resistors 1180 are the same. That is, a column of reference "1" is written into the cells associated with column 1150 and a column of reference "0" is written into the cells associated with column 1160.

The reference resistors 1170 and 1180 are then converted into a reference voltage level (as will be described in connection with FIG. 11) and fed into one input of a sense amplifier 480 for determining the logic levels of a selected cell 460. Resistance values may vary over the span of a given memory array and the transmission of a reference value (or voltage) across a memory array 150 for comparison with a selected memory cell 460 can detrimentally affect the integrity of the reference value and compromise the comparison. Therefore, it is recommended that the frequency and placement of the reference columns 1150, 1160 in the array 150 be whatever is practical depending upon the operating conditions and spatial considerations (e.g., noise from the substrate, decoders, size of the array, etc.) of the memory array 150.

Figure 11:
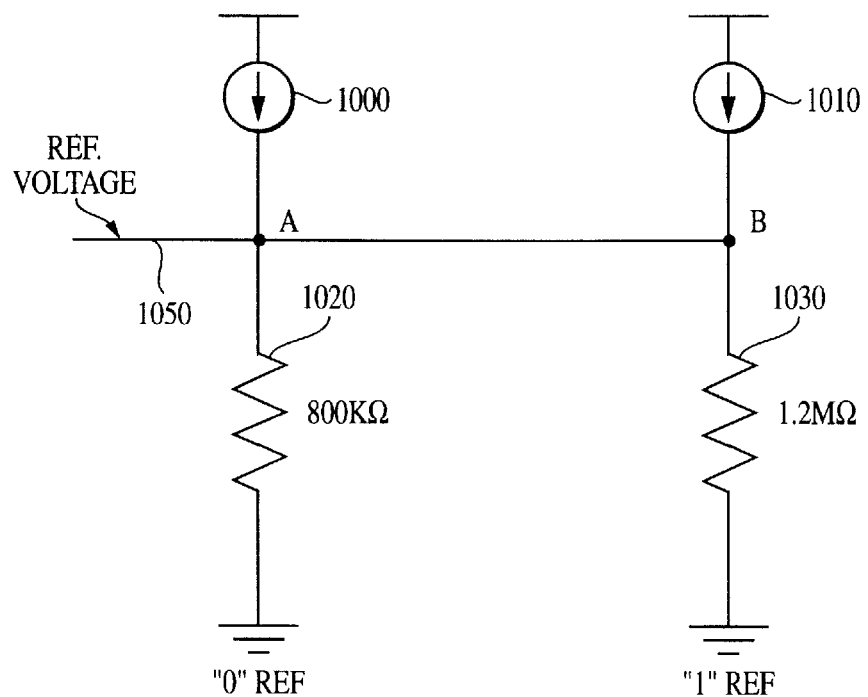
FIG. 11 illustrates a reference voltage detecting circuit in accordance with a fifth exemplary embodiment of the invention.
Figure 12:
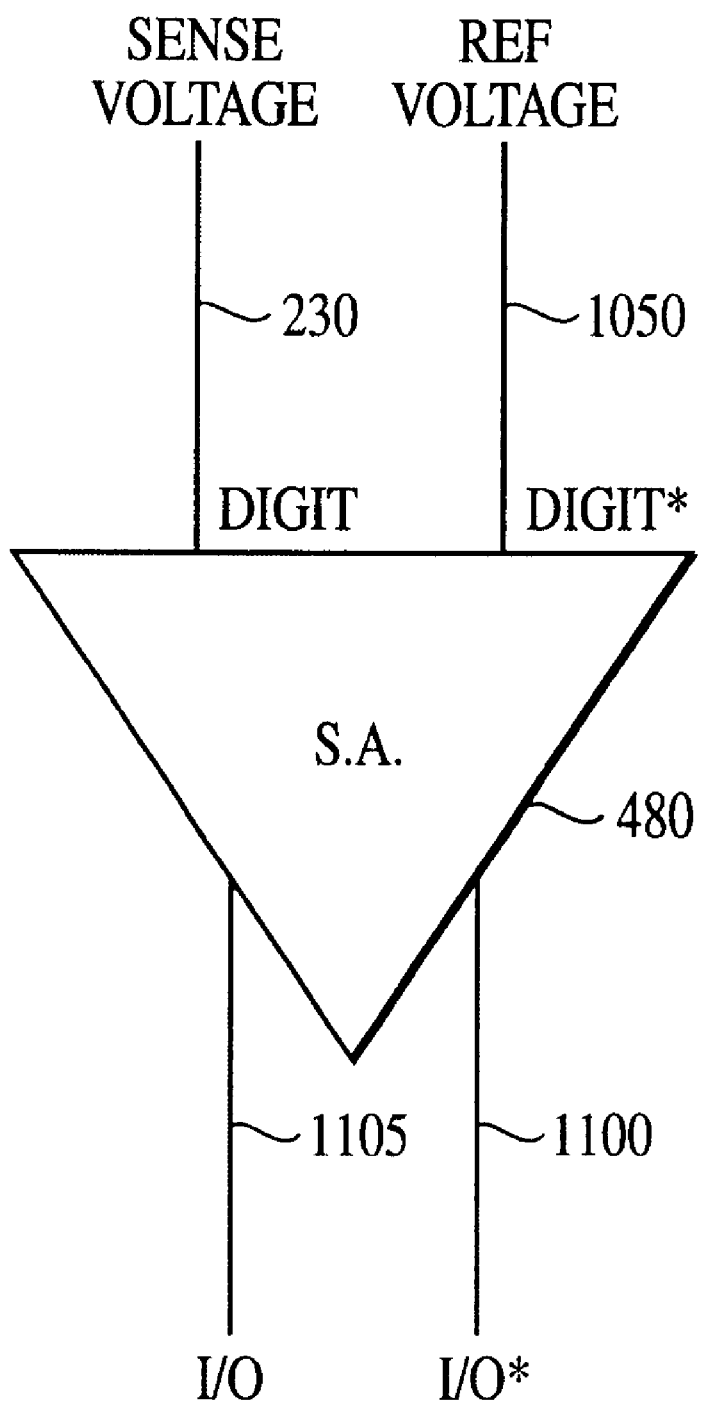
FIG. 12 illustrates a sense amplifier for use with the exemplary embodiments of the invention.

Turning now to FIG. 11, a reference voltage detecting circuit is depicted for determining a reference voltage from reference columns 1150, 1160 (of FIG. 10), in accordance with a fourth exemplary embodiment of the invention. A constant current (e.g., 1 μA) is driven through each of the reference resistances 1020, 1030 by a respective current source 1000, 1010. It should be apparent that current sources 1000, 1010 may be combined into a single current source. The reference voltage is measured on reference line 1050 and is intended to be half-way between a voltage corresponding to a "0" reference and a voltage corresponding to a "1" reference. As shown in FIG. 12, the reference voltage value measured at line 1050 is then fed into an input of a sense amplifier 480 where it is compared with a voltage measured across a resistor in a selected cell 460. If the measured voltage is greater than the reference voltage, a logic HIGH (e.g., "1") is measured in the cell. Alternatively, if the measured voltage is lower than the reference voltage, a logic LOW (e.g., "0") is measured in the cell. It should be apparent that the opposite conditions/states may hold true if so desired by the circuit designer.

The sense amplifier 480 has a first input line 230 for receiving a sense voltage measured across a resistor 210 of a selected resistor-based memory cell 460. Input line 230 is the column line of the selected cell 460. The first input line 230 is also referred to as "Digit" in the interest of being consistent with conventional dynamic random access memory (DRAM) terminology. Sense amplifier 480 also has a second input line 1050 for receiving a reference voltage from a reference voltage detecting circuit (e.g., as in FIG. 11). The second input line 1050 is referred to as "Digit*" in order to be consistent with DRAM terminology. The sense amplifier has two output lines I/O 1105 and I/O* 1100. The purpose of output lines I/O 1105 and I/O* 1100 is well known in the art and, therefore, only a brief description of their function will be described in connection with FIG. 13.

Figure 13:
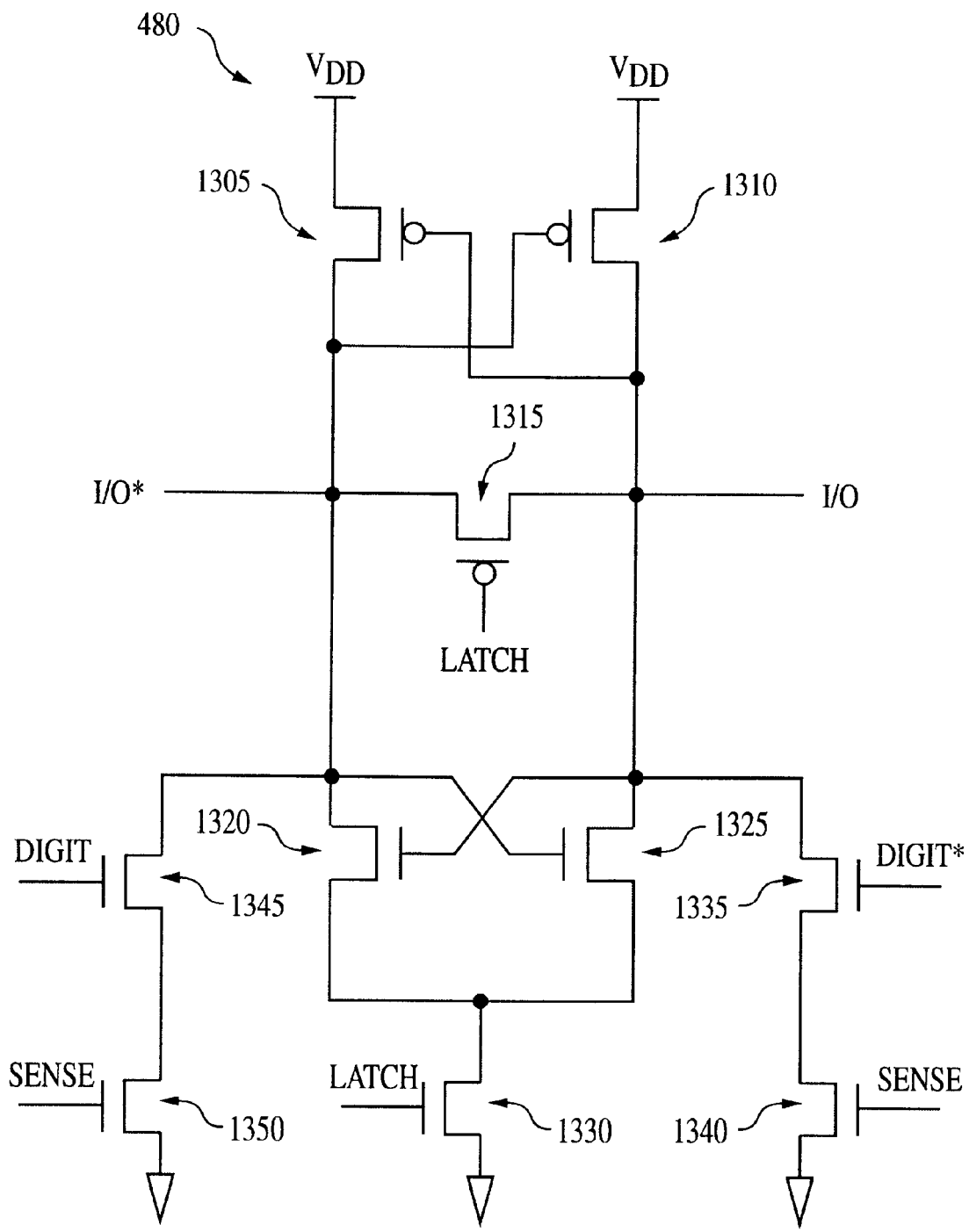
FIG. 13 illustrates a schematic diagram of the FIG. 12 sense amplifier.

Turning now to FIG. 13, an exemplary sense amplifier 480 for use with the described embodiments of the invention is depicted. The operation of sense amplifiers, in general, is well known in the art, and therefore, only a brief description will be provided herein. First respective terminals of p-type MOSFETs 1305 and 1310 are connected to $V_{DD}$ The gate of MOSFET 1310 is coupled to I/O*, a second terminal of MOSFET 1305, a first terminal of MOSFET 1315, a first terminal of MOSFET 1320, a first terminal of MOSFET 1345 and the gate of MOSFET 1325. The gate of MOSFET 1305 is coupled to I/O, a second terminal of MOSFET 1310, a second terminal of MOSFET 1315, a first terminal of MOSFET 1325, a first terminal of MOSFET 1335 and the gate of MOSFET 1320. The gate of MOSFET 1315 is coupled to "Latch." A second terminal of MOSFET 1345 is coupled to a first terminal of MOSFET 1350 and the gate of MOSFET 1345 is coupled to "Digit." A second terminal of MOSFET 1350 is coupled to ground. A second terminal of MOSFET 1335 is coupled to a first terminal of MOSFET 1340 and the gate of MOSFET 1335 is coupled to "Digit*." The gates of MOSFET 1350 and MOSFET 1340 are coupled to "Sense." Second respective terminals of MOSFET 1320 and MOSFET 1325 are coupled together and also coupled to a first terminal of MOSFET 1330. A second terminal of MOSFET 1330 is coupled to ground and the gate of MOSFET 1330 is coupled to "Latch."

Both "Sense" and "Latch" are started at logic LOW. The I/O lines are equilibrated and MOSFET 1315 is activated. When "Sense" is made logic "HIGH," the sense amplifier 480 begins sensing the resistance of the selected cell 460. When "Latch" goes logic "HIGH" the I/O lines are driven to $V_{DD}$ and ground. Also, since "Sense" is logic "HIGH," I/O cannot go all the way to $V_{DD}$. When "Sense" goes logic "LOW," and "Latch" is logic "HIGH," I/O goes all the way to $V_{DD}$, and there is no static power dissipation.

Figure 14:
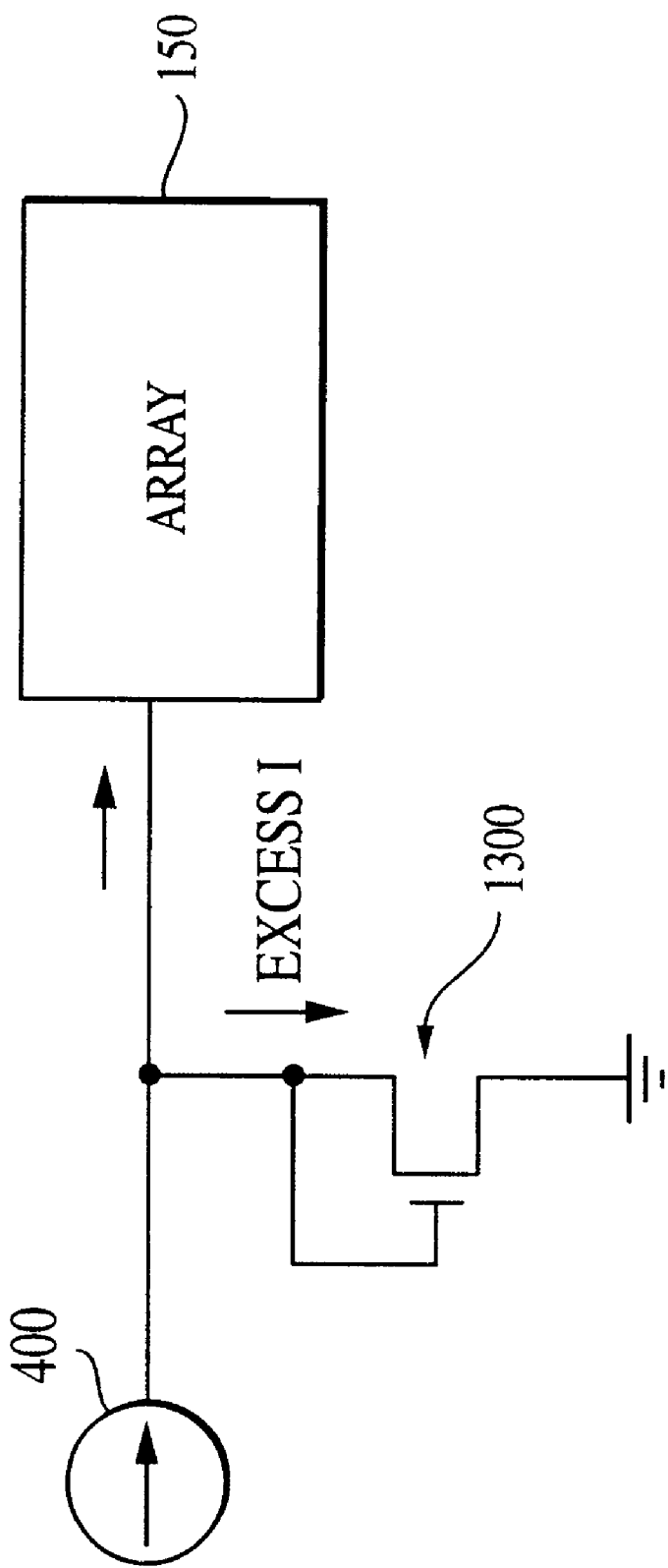
FIG. 14 illustrates a clamp circuit for use with a memory array in accordance with a sixth exemplary embodiment of the invention.

Referring now to FIG. 14, a current limiting circuit which may be used with the memory array current driver 400 is depicted. A clamp transistor 1300 is placed between a constant current source 400 and the memory array 150 such that when biasing the input current to the memory array 150, any excess current is diverted to ground rather than the array 150. This circuit prevents overcurrent to the array 150 which may cause problems including inadvertently rewriting of the values of the memory cells.

The present invention provides a method by which the resistance value of a resistor-based memory cell is sensed in a reliable manner that enables the determination of the logic value stored by the cell. A simple circuit is disclosed employing a current source 400 that drives a current through both the unused row lines and the resistor of the selected memory cell 460 and to ground. The voltage across the resistor of the selected cell 460 is measured from the column line 230 associated with the selected cell 460 to ground. The measured voltage is fed into a sense amplifier 480 where it is compared with a reference voltage and a determination is made as to the logic level being stored by the memory cell 460.

In another embodiment, the capacitance of the row line 500 and column line 230 associated with the selected cell are charged to a predetermined voltage. The capacitors are then discharged across both the combined resistance 300 of the unselected cell, and the resistor 210 associated with the selected cell 460, thereby replacing the constant current source 400.

Additionally, a feedback control loop may be utilized to monitor the voltage being measured at the resistor 210 associated with the selected cell 460, such that if the voltage deviates from a predetermined value, the current being delivered to the memory array may be increased or decreased. Another way to limit the current delivered to the memory array 150 is to introduce a current clamp 1300 between the current source 400 and the memory array 150.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in the context of MRAM, it may be used for sensing the resistance value of any system in which maintaining a resistance level is critical. In addition, while specific values of current, voltage capacitance and resistance have been used to describe the illustrated embodiments, it should be apparent that different values may be used in their place without deviating from the scope of the described embodiments. Accordingly, the invention is not limited by the foregoing description or drawings, but is only limited by the scope of the appended claims.

What is claimed as new and desired to be protected by Letters Patent of the United States is:

1. A method for sensing resistance of cells of a memory array, the method comprising:
    passing a current through each of a plurality of resistors associated with unselected memory cells of said memory array;
    passing said current through a resistor associated with a selected memory cell of said memory array; and
    measuring a voltage drop across said resistor associated with said selected memory cell to determine a resistance value of said resistor.

2. The method of claim 1, wherein said first act of passing comprises driving said current through each of a plurality of row lines associated with said unselected memory cells.

3. The method of claim 1, wherein said second act of passing comprises grounding a row line associated with said selected memory cell.

4. The method of claim 3, wherein said act of measuring comprises measuring said voltage drop across a column line associated with said selected memory cell and ground.

5. The method of claim 1, wherein said first act of passing comprises driving said current with a constant current source.

6. The method of claim 1, wherein said first act of passing comprises discharging a capacitor across each of said unselected memory cells and wherein said second act of passing comprises discharging a capacitor across said selected memory cell so as to generate a current through said unselected and selected memory cells.

7. The method of claim 6, wherein said act of discharging comprises:
    discharging a voltage stored by capacitance of a column line associated with said selected memory cell across each of said plurality of resistors associated with said unselected memory cells; and
    discharging a voltage stored by capacitance of a row line associated with said selected memory cell across said resistor associated with said selected memory cell.

8. The method of claim 1 further comprising comparing said measured voltage drop with a reference voltage to determine said resistance value.

9. The method of claim 8, wherein said act of comparing comprises sending said measured voltage to one input of a sense amplifier where it is compared with said reference voltage.

10. The method of claim 9 further comprising determining a logic level associated with said selected memory cell based upon results of said act of comparing.

11. The method of claim 1 further comprising modifying said current depending upon said voltage drop.

12. The method of claim 11, wherein said act of modifying comprises:
    receiving said voltage drop at a first input of a comparator;
    receiving a reference voltage at a second input of said comparator; and
    sending a control signal from said comparator to a current source for adjusting said current.

13. The method of claim 1 further comprising limiting said current to a predetermined value before said current passes through said memory array.

14. The method of claim 13, wherein said act of limiting comprises limiting said current with a clamp transistor.

15. The method of claim 9, wherein said act of comparing comprises receiving at said sense amplifier said reference voltage as detected by a reference voltage detecting circuit.

16. A circuit for sensing resistance of cells of a memory array, the circuit comprising:
    a plurality of resistors associated with said memory array such that when a memory cell of said array is selected, said plurality of resistors, except for a resistor associated with said selected memory cell, are connected in parallel, said resistor associated with said selected memory cell being in series with said plurality of resistors connected in parallel; and
    a current source coupled to said memory array for driving a current through said plurality of resistors connected in parallel and said resistor associated with said selected memory cell.

17. The circuit of claim 16 further comprising a voltage measurement point which, when measured, provides a value of a voltage across said resistor associated with said selected memory cell.

18. The circuit of claim 16, wherein said current source comprises a constant current source.

19. The circuit of claim 16, wherein said current source comprises a capacitor discharged across each of said plurality of resistors so as to generate a current through said resistors.

20. The circuit of claim 19, wherein said current source comprises a capacitor respectively coupled to each of said plurality of resistors connected in parallel for discharging a stored voltage across each of said plurality of resistors connected in parallel; and a capacitor coupled to said resistor associated with said selected memory cell for discharging a stored voltage across said resistor associated with said selected memory cell.

21. The circuit of claim 16, wherein each of said plurality of resistors associated with said memory array are coupled between a corresponding row line and a corresponding column line that define a memory cell of said memory array.

22. The circuit of claim 16, wherein said current source is coupled to each row line of said memory array.

23. The circuit of claim 22, wherein a row line associated with said selected memory cell is grounded thereby creating a path for said current through said selected memory cell.

24. The circuit of claim 17, wherein said voltage measurement point comprises a column line associated with said selected memory cell.

25. The circuit of claim 17 further comprising a comparator coupled to said voltage measurement point for comparing said voltage with a reference voltage to determine a resistance value of said resistor associated with said selected memory cell.

26. The circuit of claim 25, wherein said comparator comprises a sense amplifier.

27. The circuit of claim 26, wherein an input of said sense amplifier is coupled to a column line associated with said selected memory cell for receiving said voltage.

28. The circuit of claim 16, wherein each of said plurality of resistors associated with said memory cell array has a logic level associated with it depending upon a resistance value of a given resistor.

29. The circuit of claim 16, wherein said memory array comprises a random access memory (RAM).

30. The circuit of claim 29, wherein said RAM comprises a magnetic RAM.

31. The circuit of claim 17 further comprising a voltage monitor for monitoring said voltage, said voltage monitor also being coupled to said current source for modifying said current depending upon said voltage.

32. The circuit of claim 31, wherein said voltage monitor comprises:
a comparator having a first input coupled to said voltage measurement point and a second input coupled to a reference voltage, said comparator having an output coupled to said current source for transmitting a control signal to modify said current depending upon said voltage.

33. The circuit of claim 16 further comprising a current limiter coupled between said current source and said plurality of resistors for limiting said current driven through said plurality of resistors.

34. The circuit of claim 33, wherein said current limiter comprises a clamp transistor.

35. The circuit of claim 25 further comprising a reference voltage detecting circuit coupled to said comparator for transmitting said reference voltage.

36. The circuit of claim 35, wherein said reference voltage detecting circuit comprises a current source coupled to at least two parallel resistors, each of said parallel resistors having a reference value associated with a logic state that is opposite the logic state of the other resistor.

37. A circuit for sensing resistance of cells of a memory array, the circuit comprising:
a plurality of resistors associated with said memory array such that when a memory cell of said array is selected, the plurality of resistors, except for a resistor associated with said selected memory cell, is connected to form a first equivalent resistance, said resistor associated with said selected memory cell being in series with said first equivalent resistance; and
a current source coupled to said memory array for driving a current through said first equivalent resistance and said resistor associated with said selected memory cell.

38. A control system for sensing resistance of cells of a memory array, the system comprising:
a memory array comprising a plurality of resistors, each of said resistors corresponding to a memory cell of said array;
a current source coupled to said memory array for passing a current through said plurality of resistors; and
a monitor for monitoring a voltage level measured across at least a selected one of said plurality of resistors in said memory array, such that if said voltage level measured across said at least one selected resistor increases from a predetermined value, said current to said memory array is limited.

39. The system of claim 38 further comprising a current limiter coupled between said memory array and said current source for limiting said current.

40. The system of claim 38, wherein said plurality of resistors are coupled such that when a memory cell of said array is selected, said plurality of resistors, except for a resistor associated with said selected memory cell, are connected in parallel, said resistor associated with said selected memory cell being in series with said plurality of resistors connected in parallel.

41. The system of claim 38, wherein said current source comprises a constant current source.

42. The system of claim 40, wherein said current source comprises a capacitor discharged across each of said plurality of resistors so as to generate a current through said resistors.

43. The system of claim 42, wherein said current source comprises a capacitor respectively coupled to each of said plurality of resistors connected in parallel for discharging a stored voltage across each of said plurality of resistors connected in parallel; and
a capacitor coupled to said resistor associated with said selected memory cell for discharging a stored voltage across said resistor associated with said selected memory cell.

44. The system of claim 40, wherein each of said plurality of resistors associated with said memory cell array are coupled between a corresponding row line and a corresponding column line that define a memory cell of said memory array.

45. The system of claim 38, wherein said current source is coupled to each row line of said memory cell array.

46. The system of claim 38, wherein a row line associated with said selected memory cell is coupled to ground thereby creating a path for said current through said selected memory cells.

47. The system of claim 38, wherein said memory array comprises a random access memory (RAM).

48. The system of claim 47, wherein said RAM comprises a magnetic RAM.

49. A system for sensing resistance of cells of a memory array, the system comprising:
a memory array comprising a plurality of resistors, each of said resistors corresponding to a memory cell of said memory array;
a current source coupled to said memory array for passing a current through said plurality of resistors associated with memory cells;

a monitor coupled between said memory array and said current source for monitoring a voltage level measured across at least a selected one of said plurality of resistors in said memory array, such that if said voltage level measured across said at least one selected resistor increases above a predetermined value, said current to said memory array is limited; and a current limiting device coupled between said current source and said memory array for limiting said current to said memory array.

50. The system of claim 49, wherein when a memory cell of said array is selected, said plurality of resistors, except for a resistor associated with said selected memory cell, is connected in parallel, said resistor associated with said selected memory cell being in series with said plurality of resistors connected in parallel.

51. The system of claim 49, wherein said current limiting device comprises a clamping transistor for drawing excessive current from a conductor coupling said current source and said memory array.

52. The system of claim 49, wherein said memory array comprises a random access memory (RAM).

53. The system of claim 52, wherein said RAM comprises a magnetic RAM.

* * * * *